(12) United States Patent
Takenaka

(10) Patent No.: US 11,394,348 B2
(45) Date of Patent: Jul. 19, 2022

(54) POWER AMPLIFIER CIRCUIT

(71) Applicant: Murata Manufacturing Co., Ltd., Kyoto (JP)

(72) Inventor: Kiichiro Takenaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 72 days.

(21) Appl. No.: 16/854,424

(22) Filed: Apr. 21, 2020

(65) Prior Publication Data

US 2020/0343861 A1 Oct. 29, 2020

(30) Foreign Application Priority Data

Apr. 24, 2019 (JP) .............................. JP2019-083359

(51) Int. Cl.
*H03F 1/02* (2006.01)
*H03F 1/56* (2006.01)
*H03F 3/21* (2006.01)

(52) U.S. Cl.
CPC ............. *H03F 1/0288* (2013.01); *H03F 1/56* (2013.01); *H03F 3/211* (2013.01); *H03F 2200/222* (2013.01); *H03F 2200/387* (2013.01)

(58) Field of Classification Search
CPC .......... H03F 1/0288; H03F 1/56; H03F 3/211; H03F 2200/222; H03F 2200/387
USPC .......................................................... 330/297
See application file for complete search history.

(56) References Cited

U.S. PATENT DOCUMENTS

| | | | |
|---|---|---|---|
| 2013/0234793 A1* | 9/2013 | Khlat | H03F 1/0227 330/127 |
| 2016/0142020 A1 | 5/2016 | Wang | |
| 2017/0052553 A1* | 2/2017 | Gebeyehu | H03F 3/19 |
| 2018/0062578 A1 | 3/2018 | Sato et al. | |

FOREIGN PATENT DOCUMENTS

| | | |
|---|---|---|
| JP | 2011-120142 A | 6/2011 |
| JP | 2017-534219 A | 11/2017 |
| JP | 2018-037839 A | 3/2018 |

\* cited by examiner

*Primary Examiner* — Hafizur Rahman
(74) *Attorney, Agent, or Firm* — Pearne & Gordon LLP

(57) ABSTRACT

A power amplifier circuit includes a first amplifier including two amplifiers connected in series with a matching circuit interposed therebetween, a first power supply circuit that supplies a first power supply voltage to a former amplifier of the first amplifier, and a second power supply circuit that supplies a second power supply voltage to a latter amplifier of the first amplifier.

20 Claims, 13 Drawing Sheets

FIG. 3

| Pout | ET1 | ET2 |
|---|---|---|
| Pout1 ≤ Pout | ON | ON |
| Pout2 ≤ Pout<Pout1 | OFF | ON |
| Pout<Pout2 | OFF | OFF |

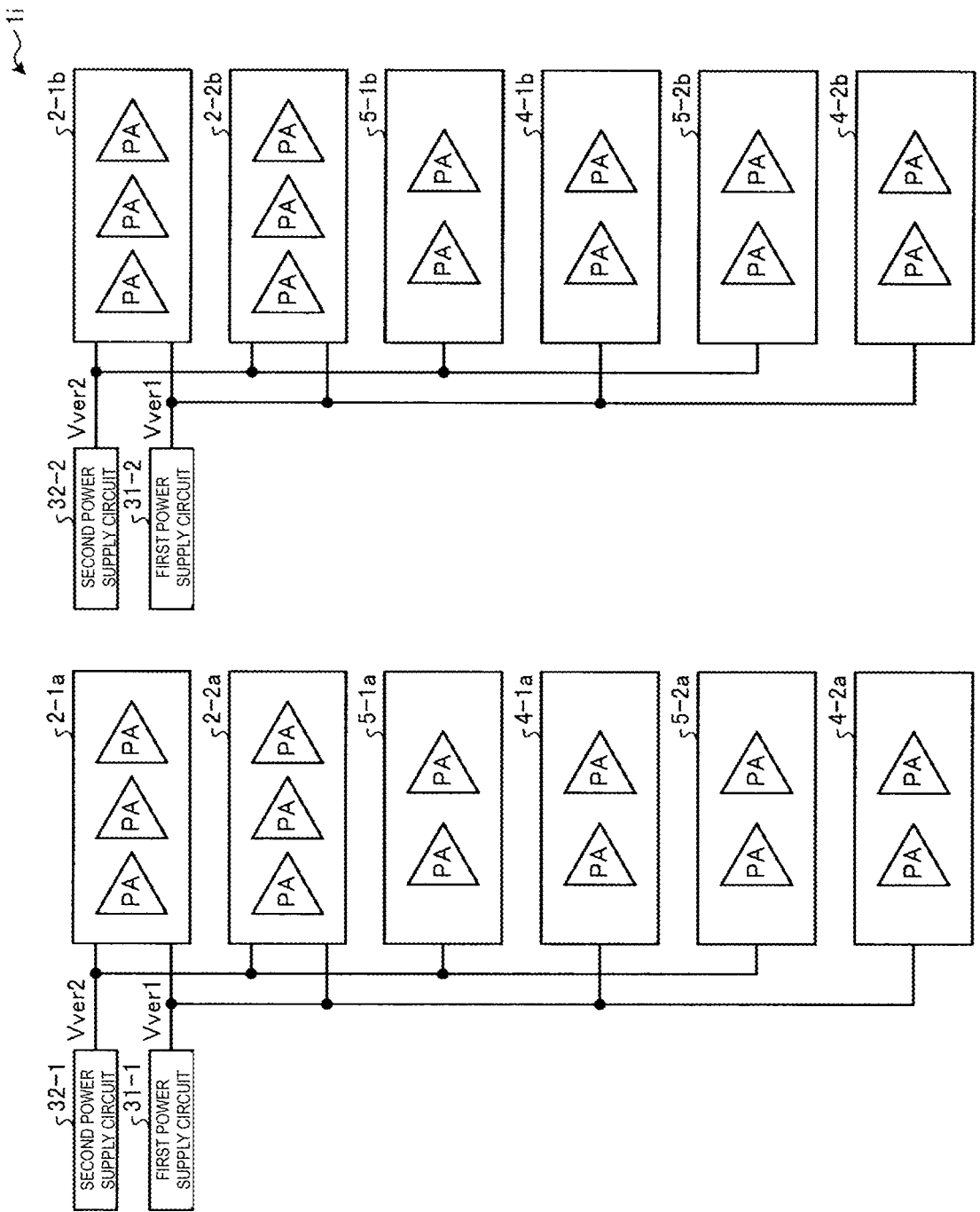

POWER AMPLIFIER CIRCUIT

This application claims priority from Japanese Patent Application No. 2019-083359 filed on Apr. 24, 2019. The content of this application is incorporated herein by reference in its entirety.

BACKGROUND

The present disclosure relates to a power amplifier circuit.

Examples of technology for increasing the efficiency of a power amplifier circuit mounted on a wireless communication terminal include envelope tracking (ET), which improves power efficiency by controlling the power supply voltage of a power amplifier according to the amplitude level of an input signal, and average power tracking (APT), which improves power efficiency by controlling the power supply voltage of a power amplifier according to the average output power. In general, envelope tracking achieves greater power efficiency than average power tracking when the output voltage of the power amplifier is great, and average power tracking achieves greater power efficiency than envelope tracking when the output power of the power amplifier is small.

In the case of performing power amplification using envelope tracking, if the power supply voltage is changed in accordance with the phase of an input signal supplied to a drive stage, due to a delay in signal propagation from the drive stage to a power stage, the phase of the input signal becomes out of phase with the phase of the power supply voltage at the power stage, which may deteriorate the distortion characteristics. For example, there is disclosed technology for suppressing, by providing a delay circuit on a power supply voltage supplying path to the power stage, deterioration of distortion characteristics caused by the difference between the phase of the input signal and the phase of the power supply voltage (for example, see Japanese Unexamined Patent Application Publication No. 2018-037839).

In recent years, modulation systems such as High-Speed Uplink Packet Access (HSUPA) and Long Term Evolution (LTE) have been adopted in wireless communication systems of mobile communication terminal apparatuses such as cellular phones and smart phones. In the fourth-generation mobile communication system, the use of multi-band carriers has been advanced, requiring the system to support a plurality of frequency bands. In addition, broader-band communication has been realized by carrier aggregation (CA) in order to increase the speed of data communication and to stabilize communication.

Along with transition to the fifth-generation mobile communication system, the circuit configuration of a front-end portion of a mobile communication terminal apparatus tends to become complex. As the front-end portion becomes complex, a power amplifier circuit at a previous stage is also required to support multi-band and broadband communication. In particular, in Sub 6 of the fifth-generation mobile communication system and the 5 GHz frequency band of Wi-Fi (IEEE (The Institute of Electrical and Electronics Engineers, Inc.) 802.11), a first stage is sometimes provided before a drive stage in order to secure a sufficient amplifier gain, resulting in a three-stage configuration in combination with a power stage. Furthermore, 5 GNR (New Ratio) has a wide modulation bandwidth of power supply voltage in envelope tracking, and thus is susceptible to distortion due to the phase delay of an input signal supplied to the power stage. The configuration discussed in Japanese Unexamined Patent Application Publication No. 2018-037839 in which a delay circuit is provided on a power supply voltage supplying path has a large insertion loss. In addition, a delay time may not be obtained with sufficient accuracy, resulting in reduction of accuracy in tracking the power supply voltage.

BRIEF SUMMARY

The present disclosure realizes power amplification with low distortion and high efficiency.

According to embodiments of the present disclosure, a power amplifier circuit includes a first amplifier including two amplifiers connected in series with a matching circuit interposed therebetween, a first power supply circuit that supplies a first power supply voltage to a former amplifier of the first amplifier, and a second power supply circuit that supplies a second power supply voltage to a latter amplifier of the first amplifier.

In this configuration, power supply voltages are supplied from different power supply circuits to the former amplifier and the latter amplifier. Accordingly, the power supply voltage may be controlled appropriately for the former amplifier and the latter amplifier according to the output voltage of the first amplifier, thereby realizing power amplification with low distortion and high efficiency.

According to embodiments of the present disclosure, power amplification with low distortion and high efficiency may be realized.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 3 is a diagram illustrating an example in which how the operation mode of the power amplifier circuit according to the first embodiment is managed;

FIG. 12 is a diagram illustrating a sixth example of the schematic configuration of the power amplifier circuit according to the third embodiment.

DETAILED DESCRIPTION

Hereinafter, a power amplifier circuit according to embodiments will be described in detail on the basis of the drawings. It shall be noted that the present disclosure is not limited by these embodiments. The embodiments are only exemplary, and, needless to say, a partial replacement or combination of configurations discussed in different embodiments is possible. From a second embodiment onward, descriptions of matters that are common to those of a first embodiment will be omitted, and only different points will be described. In particular, the same or similar advantageous effects achieved by the same or similar configuration will not be mentioned in each of the embodiments.

First Embodiment

Figure 1:
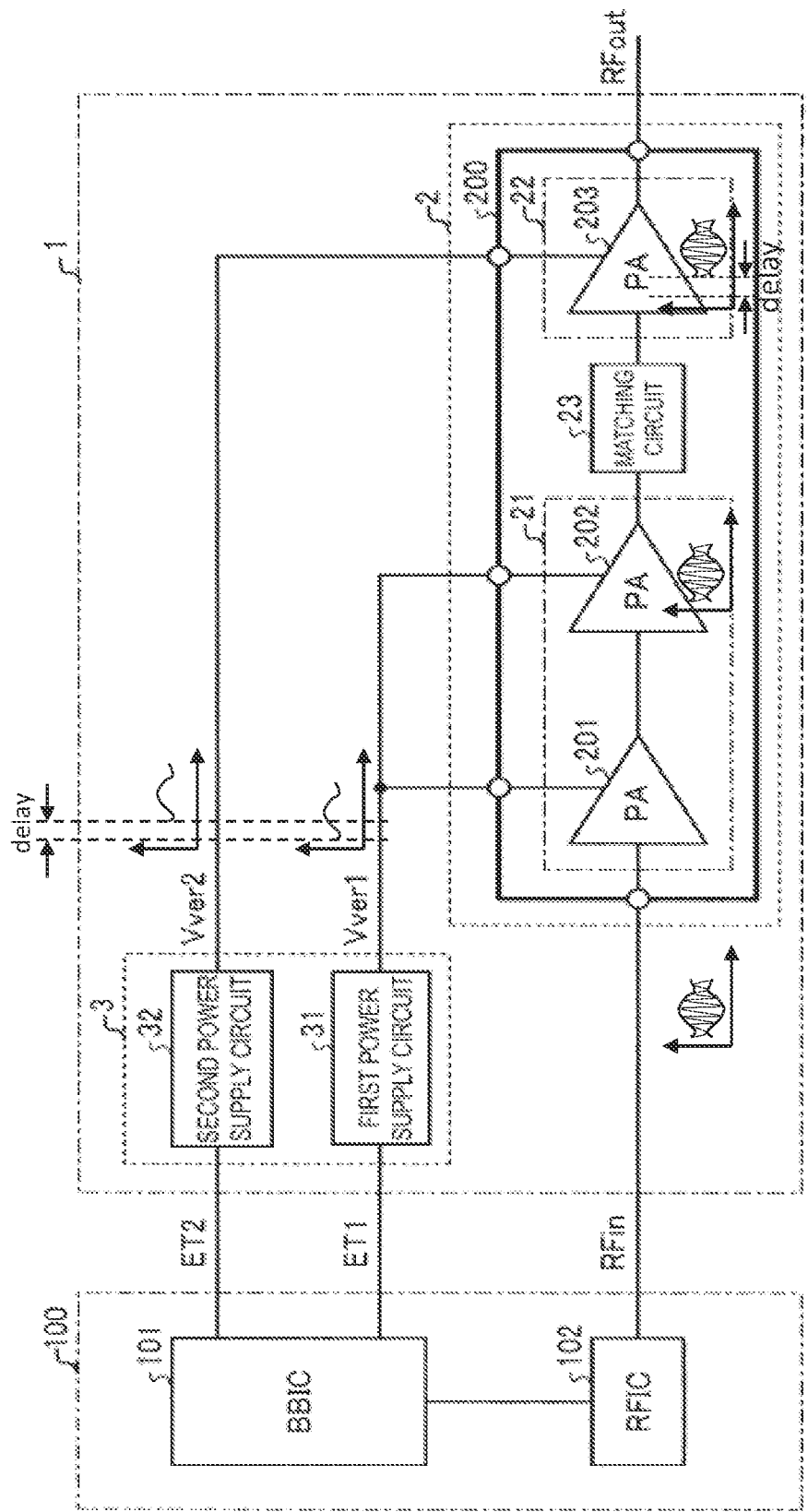
FIG. 1 is a diagram illustrating the configuration of a power amplifier circuit according to a first embodiment.

FIG. 1 is a diagram illustrating the configuration of a power amplifier circuit according to the first embodiment. A power amplifier circuit 1 according to the first embodiment is mounted on, for example, a wireless communication terminal that supports radio frequency (RF) communication using Sub 6 of the fifth-generation mobile communication system or the 5 GHz frequency band of Wi-Fi.

The power amplifier circuit 1 amplifies an RF input signal RFin input from a radio-frequency integrated circuit (RFIC) 102 of a controller 100, and outputs an RF output signal RFout. As illustrated in FIG. 1, the power amplifier circuit 1 according to the first embodiment includes an amplifier (first amplifier or first amplifier unit) 2 and a power supply circuit 3.

In the amplifier (first amplifier) 2, a former amplifier 21 and a latter amplifier 22 are connected in series with a matching circuit 23 interposed therebetween. The former amplifier 21 includes power amplifiers (PAs) 201 and 202. The power amplifier (PA) 201 and the power amplifier (PA) 202 are connected in series. The latter amplifier 22 includes a power amplifier (PA) 203. That is, the amplifier (first amplifier) 2 is a three-stage-configuration RF power amplifier configured by connecting in series the power amplifier (PA) 201 at a first stage, the power amplifier (PA) 202 at a drive stage, and the power amplifier (PA) 203 at a power stage. The power amplifiers (PAs) 201, 202, and 203 and the matching circuit 23 are included in a power amplifier module (PAM) 200. Although not illustrated in the drawings, a matching circuit is respectively provided between the input and output of the amplifier (first amplifier) 2 and between the power amplifiers (PAs) 201 and 202.

Figure 2A:
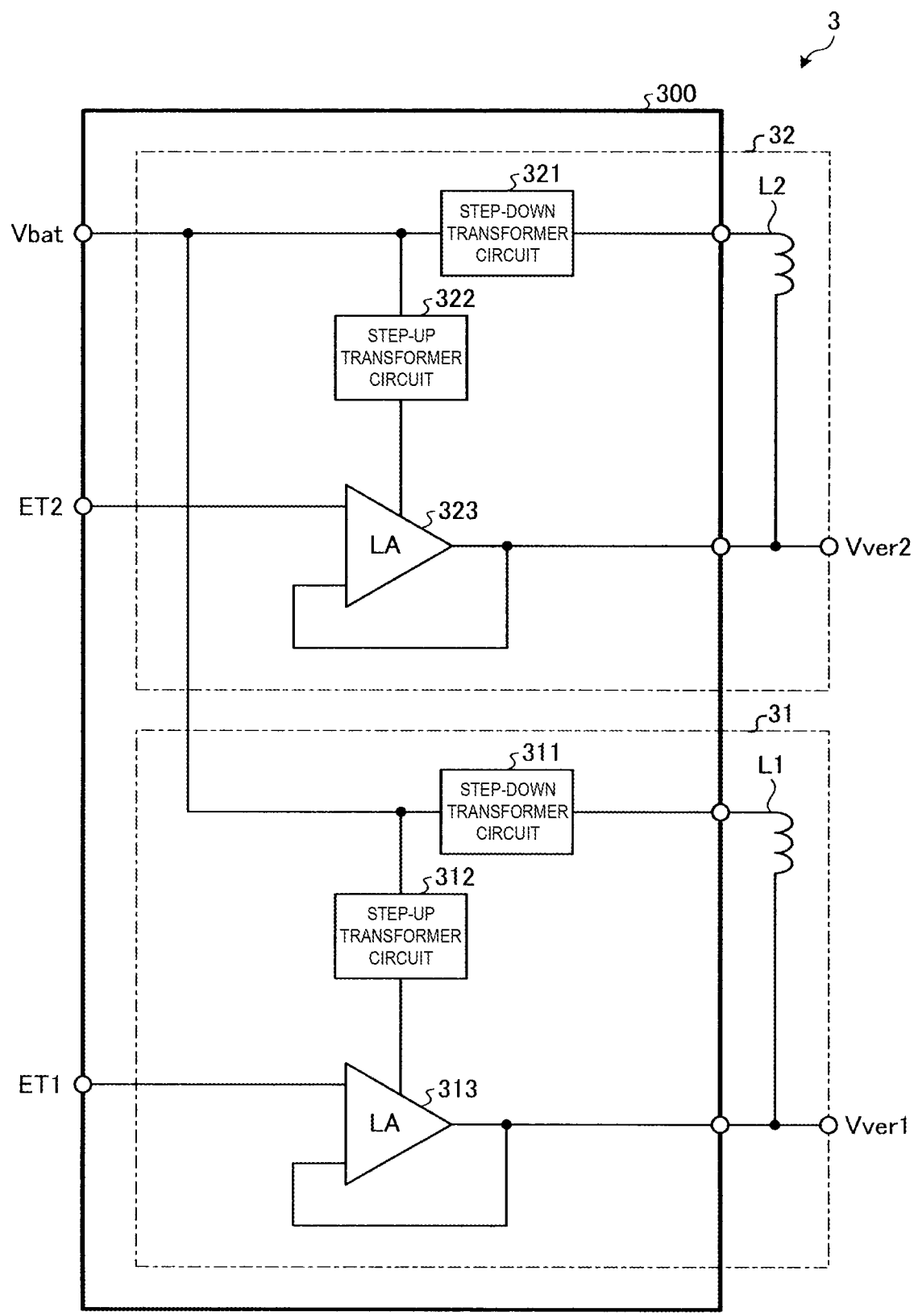
FIG. 2A is a diagram illustrating a first exemplary configuration of a power supply circuit.
Figure 2B:
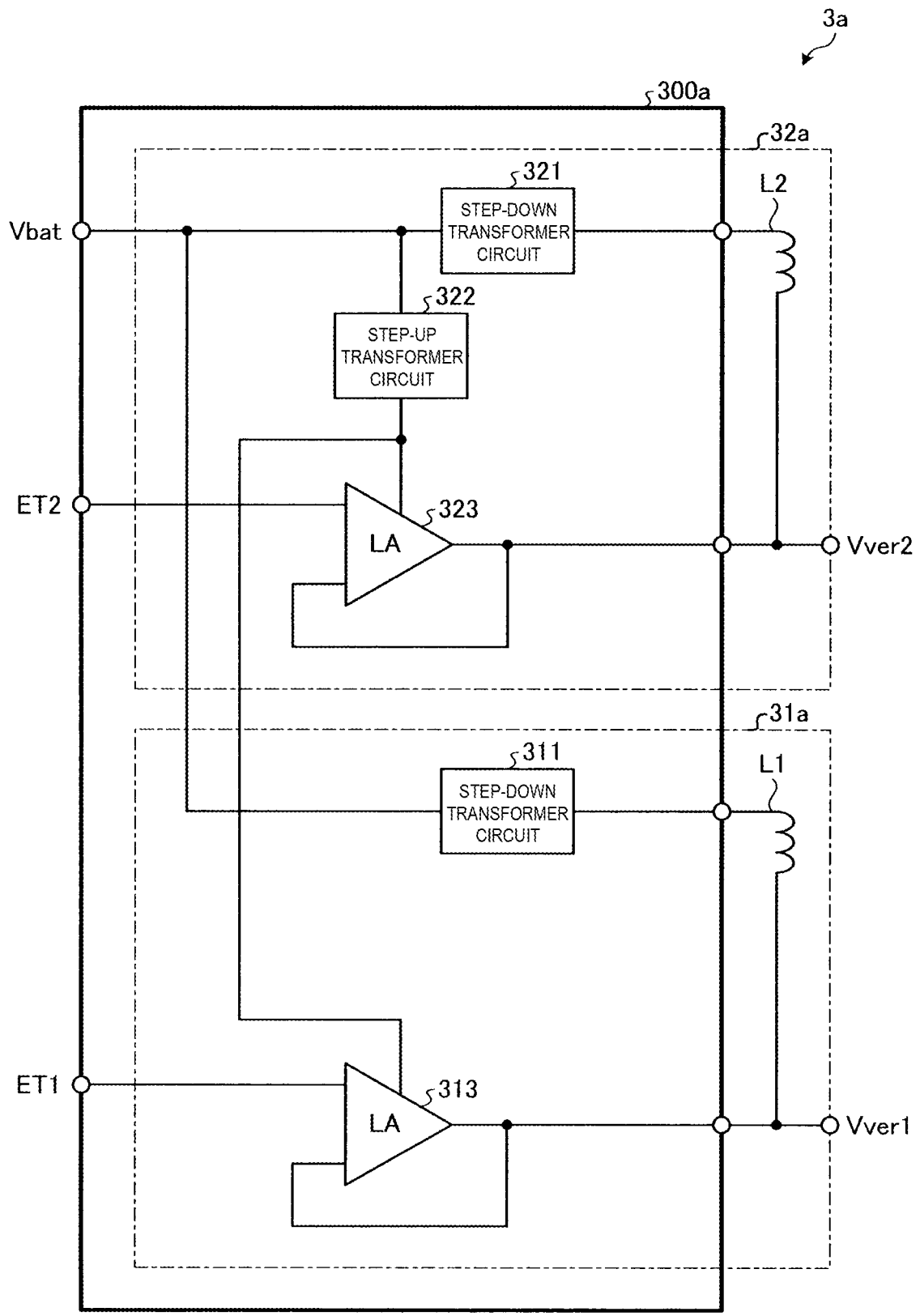
FIG. 2B is a diagram illustrating a second exemplary configuration of the power supply circuit.

The power supply circuit 3 includes a first power supply circuit 31 and a second power supply circuit 32. FIG. 2A is a diagram illustrating a first exemplary configuration of the power supply circuit. FIG. 2B is a diagram illustrating a second exemplary configuration of the power supply circuit.

For example, a battery power supply voltage Vbat is applied from a battery mounted on the wireless communication terminal to the power supply circuit 3. In addition, a first envelope signal ET1 and a second envelope signal ET2 are input from a baseband integrated circuit (BBIC) 101 of the controller 100 to the power supply circuit 3.

In the present embodiment, a first power supply voltage Vver1 is supplied from the first power supply circuit 31 to the former amplifier 21 of the amplifier (first amplifier) 2. In addition, a second power supply voltage Vver2 is supplied from the second power supply circuit 32 to the latter amplifier 22 of the amplifier (first amplifier) 2. That is, the first power supply voltage Vver1 is supplied to the power amplifier (PA) 201 at the first stage and the power amplifier (PA) 202 at the drive stage, and the second power supply voltage Vver2 is supplied to the power amplifier (PA) 203 at the power stage.

As illustrated in FIG. 2A, the first power supply circuit 31 includes a step-down transformer circuit 311, a step-up transformer circuit 312, a linear amplifier (LA) 313, and an inductor L1. In addition, the second power supply circuit 32 includes a step-down transformer circuit 321, a step-up transformer circuit 322, a linear amplifier (LA) 323, and an inductor L2. The step-down transformer circuits 311 and 321, the step-up transformer circuits 312 and 322, and the linear amplifiers (LAs) 313 and 323 are included in an envelope tracking (ET) modulator integrated circuit (IC) 300.

The step-down transformer circuit 311 decreases the battery power supply voltage Vbat, and supplies a power supply voltage via the inductor L1 when the former amplifier 21 of the amplifier (first amplifier) 2 performs power amplification using average power tracking (APT).

The step-up transformer circuit 312 increases the battery power supply voltage Vbat, and supplies the increased voltage to the linear amplifier (LA) 313.

On the basis of the first envelope signal ET1 supplied from the BBIC 101 of the controller 100, the linear amplifier (LA) 313 generates and supplies a power supply voltage when the former amplifier 21 of the amplifier (first amplifier) 2 performs power amplification using envelope tracking (ET). The linear amplifier (LA) 313 operates as an error amplifier for a difference that the step-down transformer circuit 311 is unable to follow.

With the above-described configuration, the first power supply voltage Vver1, which is supplied to the former amplifier 21 of the amplifier (first amplifier) 2, is generated.

The step-down transformer circuit 321 decreases the battery power supply voltage Vbat, and supplies a power supply voltage via the inductor L2 when the latter amplifier 22 of the amplifier (first amplifier) 2 performs power amplification using average power tracking (APT).

The step-up transformer circuit 322 increases the battery power supply voltage Vbat, and supplies the increased voltage to the linear amplifier (LA) 323.

On the basis of the second envelope signal ET2 supplied from the BBIC 101 of the controller 100, the linear amplifier (LA) 323 generates and supplies a power supply voltage when the latter amplifier 22 of the amplifier (first amplifier) 2 performs power amplification using envelope tracking (ET). The linear amplifier (LA) 323 operates as an error amplifier for a difference that the step-down transformer circuit 321 is unable to follow.

With the above-described configuration, the second power supply voltage Vver2, which is supplied to the latter amplifier 22 of the amplifier (first amplifier) 2, is generated.

Note that, as illustrated in FIG. 2B, the step-up transformer circuit 312 may not be provided, and the step-up transformer circuit 322 may be shared by a first power supply circuit 31a and a second power supply circuit 32a. In this case, the first power supply circuit 31a includes the step-down transformer circuit 311 and the linear amplifier (LA) 313. In addition, the second power supply circuit 32a includes the step-down transformer circuit 321, the step-up transformer circuit 322, the linear amplifier (LA) 323, and the inductor L2. The step-down transformer circuits 311 and 321, the step-up transformer circuit 322, and the linear amplifiers (LAs) 313 and 323 are included in an ET modulator IC 300a.

The operation of the power amplifier circuit 1 according to the above-described first embodiment will be described with reference to FIG. 3. FIG. 3 is a diagram illustrating an example in which how the operation mode of the power amplifier circuit according to the first embodiment is managed.

The power amplifier circuit 1 according to the first embodiment is able to switch between, individually for the former amplifier 21 and the latter amplifier 22, power amplification using envelope tracking (ET) and power amplification using average power tracking (APT) according to the output voltage of the amplifier (first amplifier) 2.

In the present embodiment, as illustrated in FIG. 3, certain first output power Pout1 and certain second output power Pout 2 are provided as thresholds for the output voltage Pout of the amplifier (first amplifier) 2. The second output power Pout2 is set to a value less than the first output power Pout1. The first output power Pout1 may be set to, for example, about [dBm]. The second output power Pout2 may be set to, for example, about 0 [dBm].

In the following description, the operation mode in which power is amplified when the output power Pout of the amplifier (first amplifier) 2 is greater than or equal to the first output power Pout1 (Pout1 Pout) is sometimes referred to as a high power mode. In addition, the operation mode in which power is amplified when the output power Pout is greater than or equal to the second output power Pout2 and less than the first output power Pout1 (Pout2 Pout Pout1) is sometimes referred to as a middle power mode. In addition, the operation mode in which power is amplified when the output power Pout is less than the second output power Pout2 (Pout Pout2) is sometimes referred to as a low power mode. The high power mode in the present embodiment corresponds to a "first mode" in the present disclosure. The middle power mode in the present embodiment corresponds to a "second mode" in the present disclosure. The low power mode in the present embodiment corresponds to a "third mode" in the present disclosure.

When the output power Pout of the amplifier (first amplifier) 2 is greater than or equal to the first output power Pout1 (Pout1 Pout), the power amplifier circuit 1 operates in the high power mode. In the high power mode, the former amplifier 21 and the latter amplifier 22 of the amplifier (first amplifier) 2, that is, the power amplifier (PA) 201 at the first stage, the power amplifier (PA) 202 at the drive stage, and the power amplifier (PA) 203 at the power stage, perform power amplification using envelope tracking (ET).

At this time, as illustrated in FIG. 3, the first envelope signal ET1 becomes ON and is input to the first power supply circuit 31. The first envelope signal ET1 is a signal controlled to allow the first power supply voltage Vver1 supplied from the first power supply circuit 31 to become a level in accordance with the envelope (amplitude level) of the output signal of the former amplifier 21. The first power supply circuit 31 generates the first power supply voltage Vver1 on the basis of the first envelope signal ET1.

In addition, as illustrated in FIG. 3, the second envelope signal ET2 becomes ON and is input to the second power supply circuit 32. The second envelope signal ET2 is a signal controlled to allow the second power supply voltage Vver2 supplied from the second power supply circuit 32 to become a level in accordance with the envelope (amplitude level) of the output signal of the latter amplifier 22. As illustrated in FIG. 1, the phase of the second envelope signal ET2 is delayed from the first envelope signal ET1 by a signal propagation delay of an input signal supplied to the latter amplifier 22 with respect to the RF input signal RFin. The second power supply circuit 32 generates the second power supply voltage Vver2 on the basis of the second envelope signal ET2.

When the output power Pout of the amplifier (first amplifier) 2 is greater than or equal to the second output power Pout2 and less than the first output power (Pout2≤Pout<Pout1), the power amplifier circuit 1 operates in the middle power mode. In the middle power mode, the former amplifier 21 of the amplifier (first amplifier) 2, that is, the power amplifier (PA) 201 at the first stage and the power amplifier (PA) 202 at the drive stage, performs power amplification using average power tracking (APT). In addition, the latter amplifier 22 of the amplifier (first amplifier) 2, that is, the power amplifier (PA) 203 at the power stage, performs power amplification using envelope tracking (ET).

At this time, as illustrated in FIG. 3, the first envelope signal ET1 becomes OFF, and the first power supply voltage Vver1 supplied from the first power supply circuit 31 is controlled to become a level in accordance with the average output power of the former amplifier 21.

In addition, as illustrated in FIG. 3, the second envelope signal ET2 becomes ON and is input to the second power supply circuit 32. The second power supply circuit 32 generates the second power supply voltage Vver2 on the basis of the second envelope signal ET2.

When the output power Pout of the amplifier (first amplifier) 2 is less than the second output power Pout2 (Pout<Pout2), the power amplifier circuit 1 operates in the low power mode. In the low power mode, the former amplifier 21 and the latter amplifier 22 of the amplifier (first amplifier) 2, that is, the power amplifier (PA) 201 at the first stage, the power amplifier (PA) 202 at the drive stage, and the power amplifier (PA) 203 at the power stage, perform power amplification using average power tracking (APT).

At this time, as illustrated in FIG. 3, the first envelope signal ET1 becomes OFF, and the first power supply voltage Vver1 supplied from the first power supply circuit 31 is controlled to become a level in accordance with the average output power of the former amplifier 21.

In addition, as illustrated in FIG. 3, the second envelope signal ET2 becomes OFF, and the second power supply voltage Vver2 supplied from the second power supply circuit 32 is controlled to become a level in accordance with the average output power of the latter amplifier 22.

As described above, the power amplifier circuit 1 according to the present embodiment performs power amplification using envelope tracking (ET) with both the former amplifier 21 and the latter amplifier 22 in the high power mode; performs power amplification using average power tracking (APT) with the former amplifier 21, whose output power is relatively small, in the middle power mode; and performs power amplification using average power tracking (APT) with both the former amplifier 21 and the latter amplifier 22 in the low power mode. Accordingly, the power efficiency in each operation mode may be improved.

In addition, the second power supply voltage Vver2, which is delayed by a signal propagation delay of an input signal supplied to the latter amplifier 22 with respect to the RF input signal RFin, is generated in envelope tracking (ET), thereby suppressing deterioration of the distortion characteristics of the RF output signal RFout due to the difference between the phase of the input signal supplied to the latter amplifier 22 and the phase of the second power supply voltage Vver2, as illustrated in FIG. 1. In addition, unlike the configuration in which a delay circuit is provided on a power supply voltage supplying path to the latter amplifier 22, highly efficient power amplification which suppresses an insertion loss may be performed.

Figure 4:
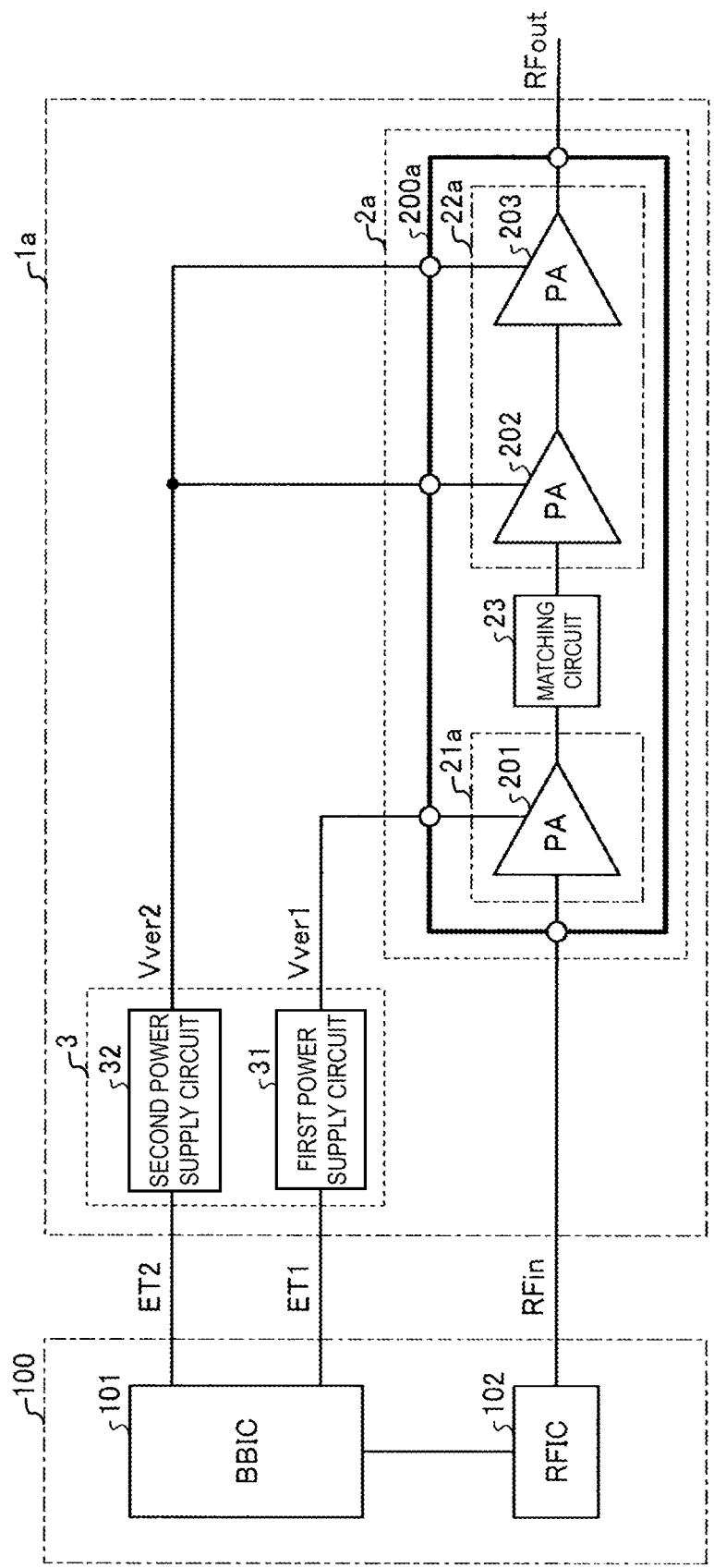
FIG. 4 is a diagram illustrating the configuration of a power amplifier circuit according to a modification of the first embodiment.

FIG. 4 is a diagram illustrating the configuration of a power amplifier circuit according to a modification of the first embodiment. The power amplifier circuit may have the configuration illustrated in FIG. 1 or the configuration illustrated in FIG. 4 depending on the gain distribution of the power amplifiers (PAs) 201, 202, and 203. Note that the same elements as those illustrated in FIG. 1 are given the same reference symbols, and descriptions thereof are omitted.

In a power amplifier circuit 1a according to the modification of the first embodiment illustrated in FIG. 4, an amplifier (first amplifier) 2a has a configuration in which a former amplifier 21a includes the power amplifier (PA) 201, and a latter amplifier 22a includes the power amplifiers (PAs) 202 and 203.

In the amplifier (first amplifier) 2a, the former amplifier 21a and the latter amplifier 22a are connected in series with the matching circuit 23 interposed therebetween. The latter amplifier 22a includes the power amplifiers (PAs) 202 and 203.

The power amplifier (PA) 202 and the power amplifier (PA) 203 are connected in series. The power amplifiers (PAs) 201, 202, and 203 and the matching circuit 23 are included in a power amplifier module (PAM) 200a. Although not illustrated in the drawings, a matching circuit is respectively provided between the input and output of the amplifier (first amplifier) 2a and between the power amplifiers (PAs) 202 and 203.

In the modification of the first embodiment, the first power supply voltage Vver1 is supplied to the former amplifier 21a of the amplifier (first amplifier) 2a, that is, the power amplifier (PA) 201 at the first stage, and the second power supply voltage Vver2 is supplied to the latter amplifier 22a, that is, the power amplifier (PA) 202 at the drive stage and the power amplifier (PA) 203 at the power stage.

When the output power Pout of the amplifier (first amplifier) 2a is greater than or equal to the first output power Pout1 (Pout1 Pout), the power amplifier circuit 1a operates in the high power mode. In the high power mode, the former amplifier 21a and the latter amplifier 22a of the amplifier (first amplifier) 2a, that is, the power amplifier (PA) 201 at the first stage, the power amplifier (PA) 202 at the drive stage, and the power amplifier (PA) 203 at the power stage, perform power amplification using envelope tracking (ET).

When the output power Pout of the amplifier (first amplifier) 2a is greater than or equal to the second output power Pout2 and less than the first output power (Pout2≤Pout<Pout1), the power amplifier circuit 1a operates in the middle power mode. In the middle power mode, the former amplifier 21a of the amplifier (first amplifier) 2a, that is, the power amplifier (PA) 201 at the first stage, performs power amplification using average power tracking (APT). In addition, the latter amplifier 22a of the amplifier (first amplifier) 2a, that is, the power amplifier (PA) 202 at the drive stage and the power amplifier (PA) 203 at the power stage, performs power amplification using envelope tracking (ET).

When the output power Pout of the amplifier (first amplifier) 2a is less than the second output power Pout2 (Pout<Pout2), the power amplifier circuit 1a operates in the low power mode. In the low power mode, the former amplifier 21a and the latter amplifier 22a of the amplifier (first amplifier) 2a, that is, the power amplifier (PA) 201 at the first stage, the power amplifier (PA) 202 at the drive stage, and the power amplifier (PA) 203 at the power stage, perform power amplification using average power tracking (APT).

Although the above-described first embodiment has discussed the exemplary configuration in which the envelope signal becomes OFF when performing power amplification using average power tracking (APT), the present disclosure is not limited to this configuration. For example, the configuration may be as follows. That is, a bias circuit that turns off a linear amplifier (LA) is provided in the power supply circuit 3. A control signal indicating whether to perform power amplification using envelope tracking (ET) or power amplification using average power tracking (APT) is output from the BBIC 101 of the controller 100 to the power supply circuit 3. In the case of performing power amplification using average power tracking (APT), the linear amplifier (LA) is turned off.

Although the above-described first embodiment has discussed the example in which the amplifiers (first amplifiers) 2 and 2a are three-stage-configuration RF power amplifiers in which the power amplifiers (PAs) 201, 202, and 203 are connected in series, the amplifiers (first amplifiers) 2 and 2a may have a configuration in which two or four or more power amplifiers are connected in series. In the case where the amplifiers (first amplifiers) 2 and 2a have a configuration in which four or more power amplifiers are connected in series, the number of power amplifiers included in the former amplifier 21 and 21a and in the latter amplifiers 22 and 22a may be three or more.

Second Embodiment

Figure 5:
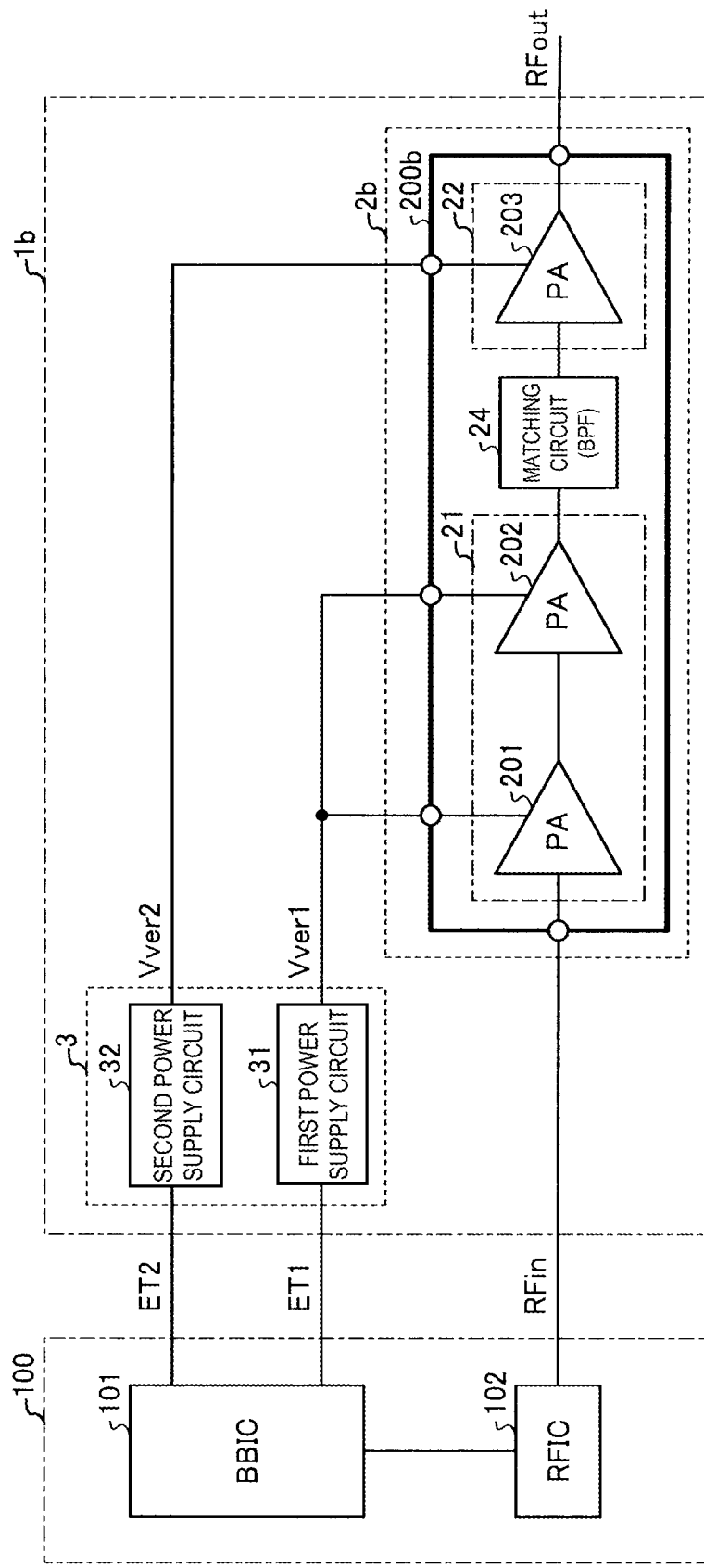
FIG. 5 is a diagram illustrating the configuration of a power amplifier circuit according to a second embodiment.
Figure 6:
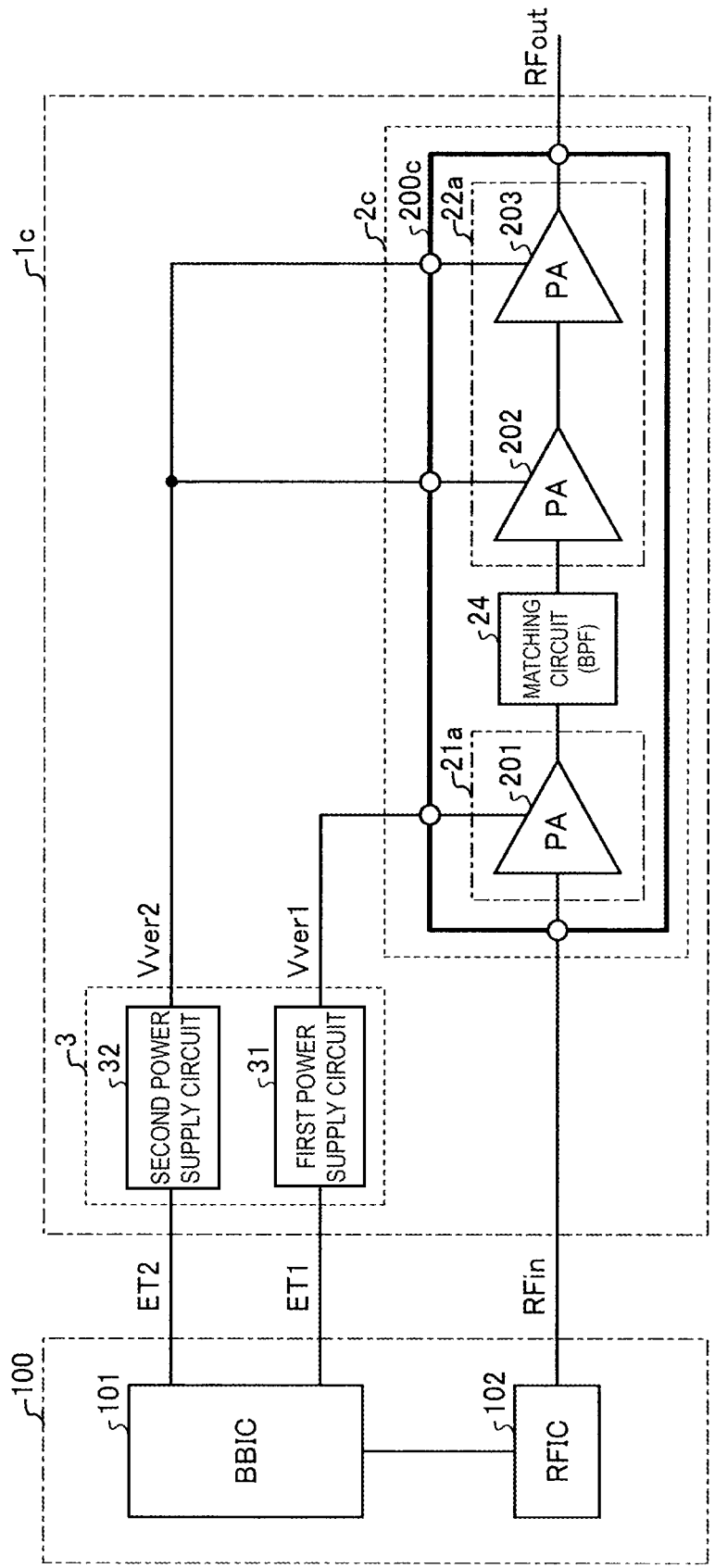
FIG. 6 is a diagram illustrating the configuration of a power amplifier circuit according to a modification of the second embodiment.

FIG. 5 is a diagram illustrating the configuration of a power amplifier circuit according to a second embodiment. FIG. 6 is a diagram illustrating the configuration of a power amplifier circuit according to a modification of the second embodiment. The power amplifier circuit may have the configuration illustrated in FIG. 5 or the configuration illustrated in FIG. 6 depending on the gain distribution of the power amplifiers (PAs) 201, 202, and 203. Note that the same elements as those of the first embodiment are given the same reference symbols, and descriptions thereof are omitted.

In a power amplifier circuit 1b of the second embodiment and a power amplifier circuit 1c of the modification of the second embodiment, a matching circuit 24 provided between the former amplifiers 21 and 21a and the latter amplifiers 22 and 22a of amplifiers (first amplifiers) 2b and 2c includes a band-pass filter (BPF). The matching circuit 24 is included in power amplifier modules (PAMs) 200b and 200c.

In the present disclosure, the passband of the band-pass filter (BPF) included in the matching circuit 24 is a frequency band handled by the power amplifier circuits 1b and 1c. Accordingly, noise input to the latter amplifiers 22 and 22a of the amplifiers (first amplifiers) 2b and 2c may be reduced.

In the case where the latter amplifiers 22 and 22a of the amplifiers (first amplifiers) 2b and 2c perform power amplification using envelope tracking (ET), the second power supply circuit 32 of the power supply circuit 3 generates the second power supply voltage Vver2 on the basis of the second envelope signal ET2. As has been described above, the second envelope signal ET2 is a signal controlled to allow the second power supply voltage Vver2 supplied to the latter amplifier 22 to become a level in accordance with the envelope (amplitude level) of the output signal of the latter amplifier 22. Thus, even with the configuration of the second embodiment in which the matching circuit 24 includes the band-pass filter (BPF), deterioration of the distortion characteristics of the RF output signal RFout due to the difference between the phase of the input signal supplied to the latter amplifiers 22 and 22a and the phase of the second power supply voltage Vver2 may be suppressed.

Third Embodiment

Figure 7:
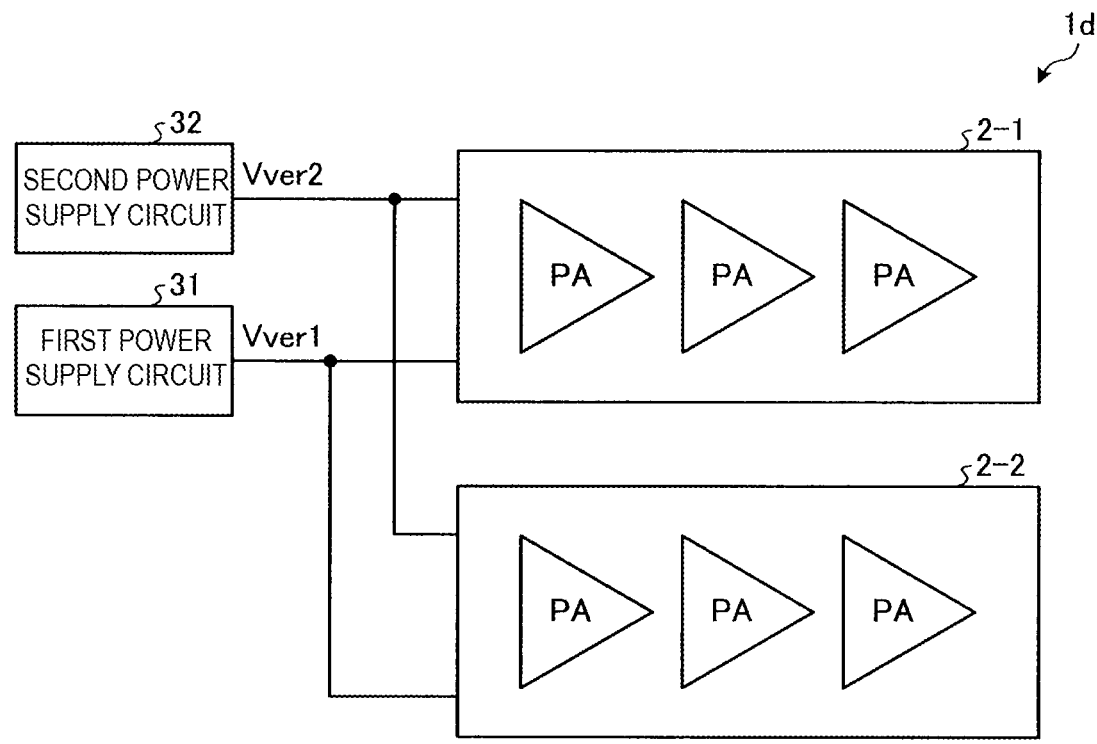
FIG. 7 is a diagram illustrating a first example of the schematic configuration of a power amplifier circuit according to a third embodiment.
Figure 8:
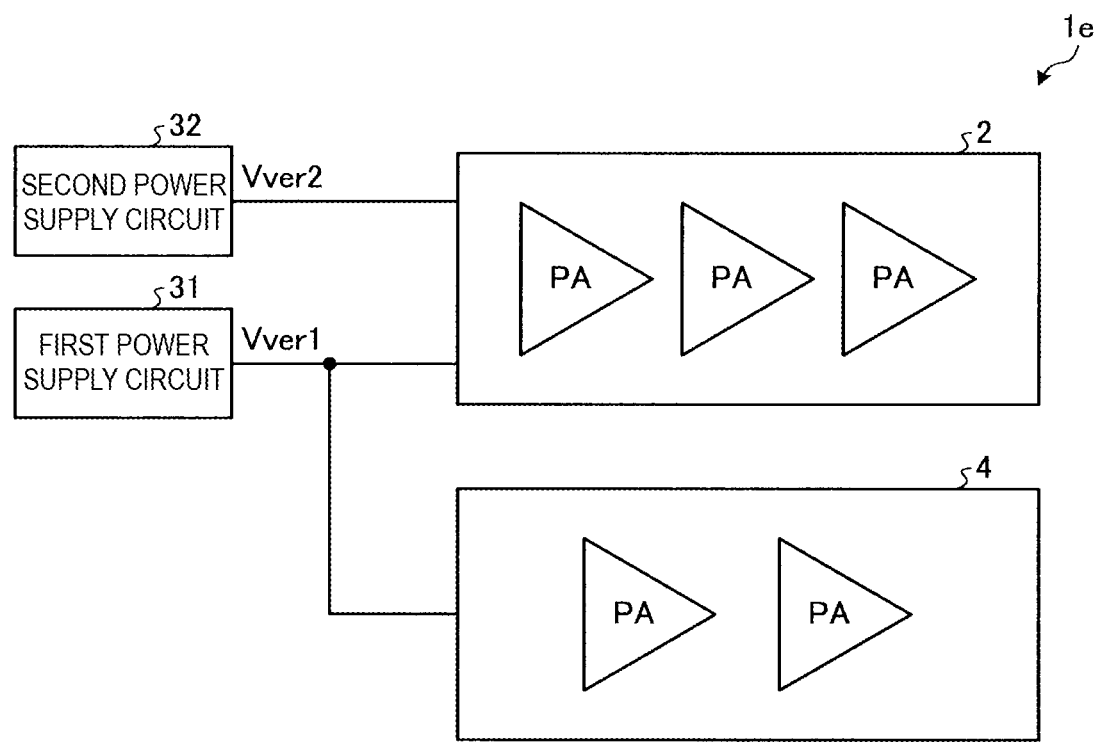
FIG. 8 is a diagram illustrating a second example of the schematic configuration of the power amplifier circuit according to the third embodiment.
Figure 9:
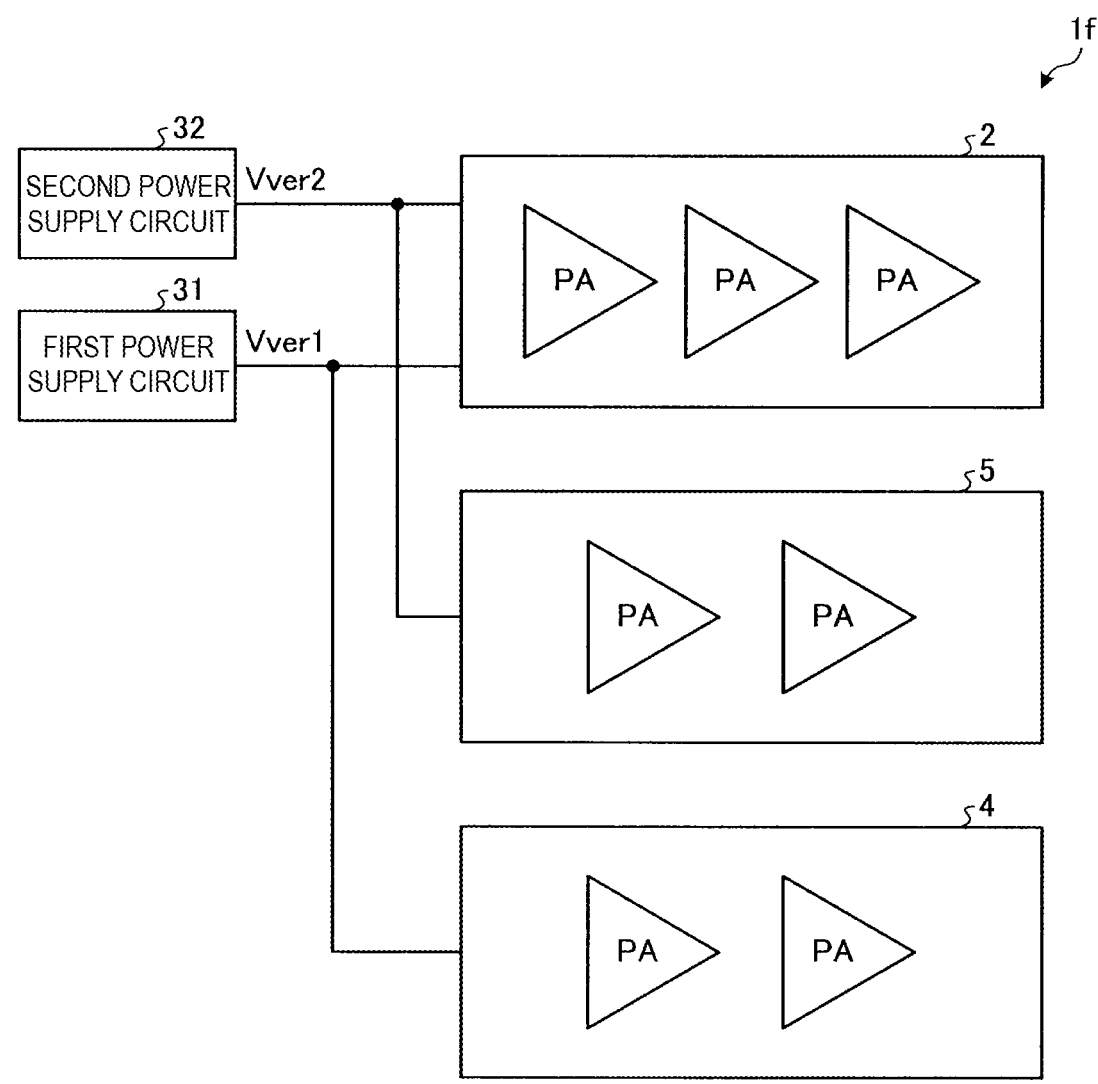
FIG. 9 is a diagram illustrating a third example of the schematic configuration of the power amplifier circuit according to the third embodiment.
Figure 10:
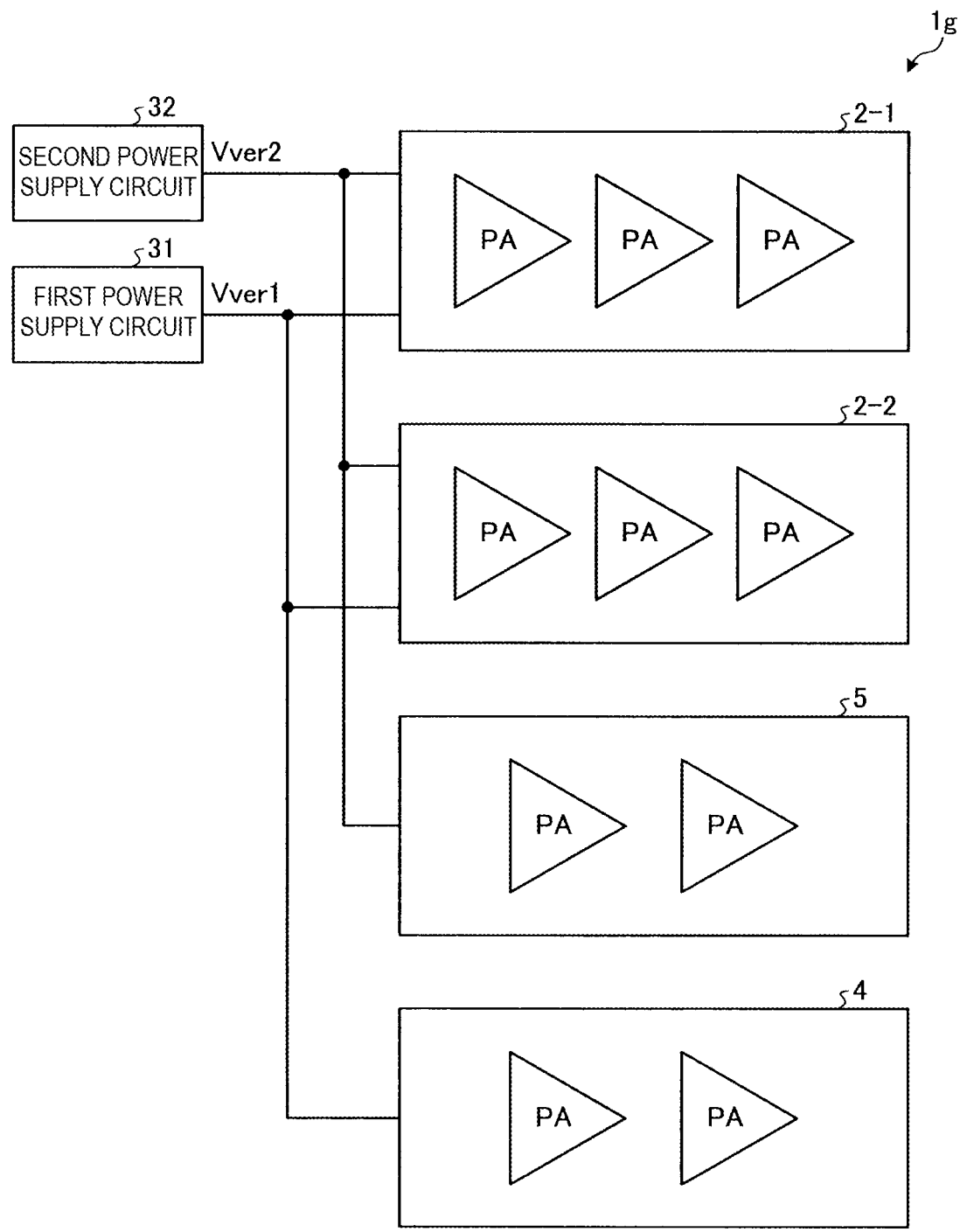
FIG. 10 is a diagram illustrating a fourth example of the schematic configuration of the power amplifier circuit according to the third embodiment.
Figure 11:
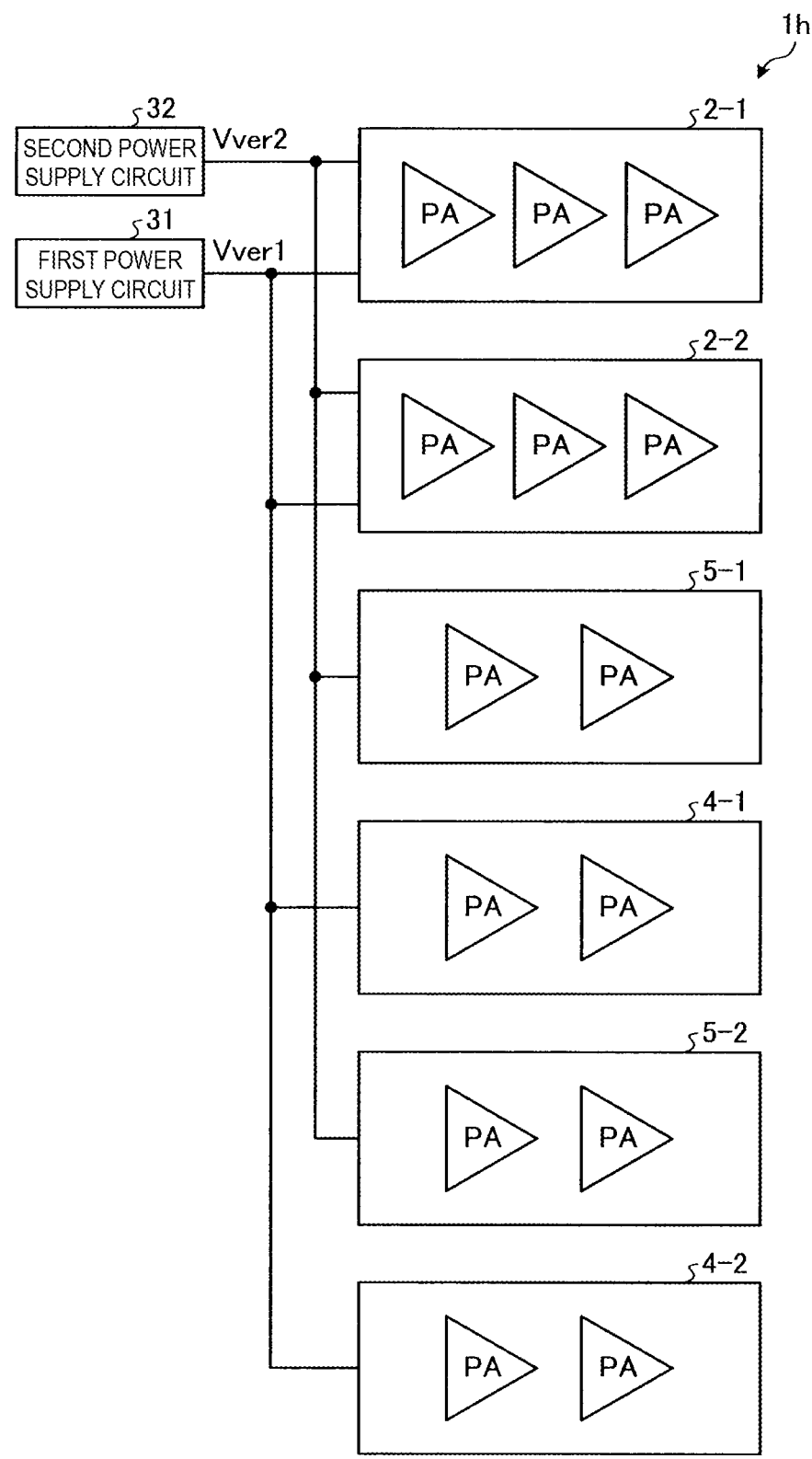
FIG. 11 is a diagram illustrating a fifth example of the schematic configuration of the power amplifier circuit according to the third embodiment.

In a third embodiment, the configuration including a plurality of amplifiers and realizing multi-band and broadband communication will be discussed. FIG. 7 is a diagram illustrating a first example of the schematic configuration of a power amplifier circuit according to a third embodiment. FIG. 8 is a diagram illustrating a second example of the schematic configuration of the power amplifier circuit according to the third embodiment. FIG. 9 is a diagram illustrating a third example of the schematic configuration of the power amplifier circuit according to the third embodiment. FIG. 10 is a diagram illustrating a fourth example of the schematic configuration of the power amplifier circuit according to the third embodiment. FIG. 11 is a diagram illustrating a fifth example of the schematic configuration of the power amplifier circuit according to the third embodiment. FIG. 12 is a diagram illustrating a sixth example of the schematic configuration of the power amplifier circuit according to the third embodiment. Illustrations of a matching circuit and so forth are omitted in FIGS. 7 to 12.

A power amplifier circuit 1d of the first example of the third embodiment illustrated in FIG. 7 includes two amplifiers (first amplifiers) 2-1 and 2-2.

In the present disclosure, the amplifier (first amplifier) 2-1 and the amplifier (first amplifier) 2-2 handle different frequency bands.

In the present disclosure, the amplifier (first amplifier) 2-1 and the amplifier (first amplifier) 2-2 operate exclusively. That is, the amplifier (first amplifier) 2-2 does not operate when the amplifier (first amplifier) 2-1 operates. In addition, the amplifier (first amplifier) 2-1 does not operate when the amplifier (first amplifier) 2-2 operates.

A power amplifier circuit 1e of the second example of the third embodiment illustrated in FIG. 8 includes an amplifier (second amplifier or second amplifier unit) 4 in addition to the amplifier (first amplifier) 2.

The amplifier (second amplifier) 4 is a two-stage-configuration RF power amplifier configured by connecting two power amplifiers (PAs) in series. The first power supply voltage Vver1 is supplied from the first power supply circuit 31 to the two power amplifiers (PAs) of the amplifier (second amplifier) 4. Note that the configuration is not limited to the above, and, alternatively, the second power supply voltage Vver2 may be supplied from the second power supply circuit 32 to the two power amplifiers (PAs) of the amplifier (second amplifier) 4.

In the present disclosure, the amplifier (first amplifier) 2 and the amplifier (second amplifier) 4 handle different frequency bands.

In the present disclosure, the amplifier (first amplifier) 2 and the amplifier (second amplifier) 4 operate exclusively. That is, the amplifier (second amplifier) 4 does not operate when the amplifier (first amplifier) 2 operates. In addition, the amplifier (first amplifier) 2 does not operate when the amplifier (second amplifier) 4 operates.

A power amplifier circuit 1f of the third example of the third embodiment illustrated in FIG. 9 includes two amplifiers (second amplifiers) 4 and 5 in addition to the amplifier (first amplifier) 2.

Like the amplifier (second amplifier or second amplifier unit) 4, the amplifier (second amplifier or second amplifier unit) 5 is a two-stage-configuration RF power amplifier configured by connecting two power amplifiers (PAs) in series. The first power supply voltage Vver1 is supplied from the first power supply circuit 31 to the two power amplifiers (PAs) of the amplifier (second amplifier) 4. The second power supply voltage Vver2 is supplied from the second power supply circuit 32 to the two power amplifiers (PAs) of the amplifier (second amplifier) 5. Note that the configuration is not limited to the above, and, alternatively, the second power supply voltage Vver2 may be supplied from the second power supply circuit 32 to the two power amplifiers (PAs) of the amplifier (second amplifier) 4, and the first power supply voltage Vver1 may be supplied from the first power supply circuit 31 to the two power amplifiers (PAs) of the amplifier (second amplifier) 5.

In the present disclosure, the amplifier (first amplifier) 2 and the amplifiers (second amplifiers) 4 and 5 handle different frequency bands.

In the present disclosure, the amplifier (first amplifier) 2 and the amplifiers (second amplifiers) 4 and 5 operate exclusively. That is, the amplifiers (second amplifiers) 4 and 5 do not operate when the amplifier (first amplifier) 2 operates. In addition, the amplifier (first amplifier) 2 does not operate when the amplifiers (second amplifiers) 4 and 5 operate.

With the configuration of the third example of the third embodiment illustrated in FIG. 9, uplink carrier aggregation (CA) using the amplifier (second amplifier) 4 and the amplifier (second amplifier) 5 may be realized.

A power amplifier circuit 1g of the fourth example of the third embodiment illustrated in FIG. 10 includes the two amplifiers (first amplifiers) 2-1 and 2-2 and the two amplifiers (second amplifiers) 4 and 5.

In the present disclosure, the amplifiers (first amplifiers) 2-1 and 2-2 and the amplifiers (second amplifiers) 4 and 5 handle different frequency bands.

In the present disclosure, the amplifier (first amplifier) 2-1, the amplifier (first amplifier) 2-2, and the amplifiers (second amplifiers) 4 and 5 operate exclusively. That is, the amplifier (first amplifier) 2-2 and the amplifiers (second amplifiers) 4 and 5 do not operate when the amplifier (first amplifier) 2-1 operates. In addition, the amplifier (first amplifier) 2-1 and the amplifiers (second amplifiers) 4 and 5 do not operate when the amplifier (first amplifier) 2-2 operates. In addition, the amplifiers (first amplifiers) 2-1 and 2-2 do not operate when the amplifiers (second amplifiers) 4 and 5 operate.

With the configuration of the fourth example of the third embodiment illustrated in FIG. 10, like the configuration of the third example of the third embodiment illustrated in FIG. 9, uplink carrier aggregation (CA) using the amplifier (second amplifier) 4 and the amplifier (second amplifier) 5 may be realized.

A power amplifier circuit 1h of the fifth example of the third embodiment illustrated in FIG. 11 includes the two amplifiers (first amplifiers) 2-1 and 2-2 and four amplifiers (second amplifiers) 4-1, 4-2, 5-1, and 5-2.

In the present disclosure, the amplifiers (first amplifiers) 2-1 and 2-2 and the amplifiers (second amplifiers) 4-1, 4-2, 5-1, and 5-2 handle different frequency bands.

In the present disclosure, the amplifier (first amplifier) 2-1, the amplifier (first amplifier) 2-2, the amplifiers (second amplifiers) 4-1 and 5-1, and the amplifiers (second amplifiers) 4-2 and 5-2 operate exclusively. That is, the amplifier (first amplifier) 2-2 and the amplifiers (second amplifiers) 4-1, 4-2, 5-1, and 5-2 do not operate when the amplifier (first amplifier) 2-1 operates. In addition, the amplifier (first amplifier) 2-1 and the amplifiers (second amplifiers) 4-1, 4-2, 5-1, and 5-2 do not operate when the amplifier (first amplifier) 2-2 operates. In addition, the amplifiers (first amplifiers) 2-1 and 2-2 and the amplifiers (second amplifiers) 4-2 and 5-2 do not operate when the amplifiers (second amplifiers) 4-1 and 5-1 operate. In addition, the amplifiers (first amplifiers) 2-1 and 2-2 and the amplifiers (second amplifiers) 4-1 and 5-1 do not operate when the amplifiers (second amplifiers) 4-2 and 5-2 operate.

With the configuration of the fifth example of the third embodiment illustrated in FIG. 11, uplink CA using a plurality of combinations of amplifiers (second amplifiers) may be realized. Specifically, uplink CA using the amplifier (second amplifier) 4-1 and the amplifier (second amplifier) 5-1 may be realized. In addition, uplink CA using the amplifier (second amplifier) 4-2 and the amplifier (second amplifier) 5-2 may be realized.

A power amplifier circuit 1*i* of the sixth example of the third embodiment illustrated in FIG. 12 includes two such configurations illustrated in FIG. 11. First power supply circuits 31-1 and 31-2 correspond to the first power supply circuit 31 illustrated in FIG. 11. Second power supply circuits 32-1 and 32-2 correspond to the second power supply circuit 32 illustrated in FIG. 11.

In the present disclosure, amplifiers (first amplifiers) 2-1*a*, 2-2*a*, 2-1*b*, and 2-2*b*, and amplifiers (second amplifiers) 4-1*a*, 4-2*a*, 5-1*a*, 5-2*a*, 4-1*b*, 4-2*b*, 5-1*b*, and 5-2*b* handle different frequency bands.

In the present disclosure, the amplifier (first amplifier) 2-1*a*, the amplifier (first amplifier) 2-2*a*, the amplifiers (second amplifiers) 4-1*a* and 5-1*a*, and the amplifiers (second amplifiers) 4-2*a* and 5-2*a* operate exclusively. That is, the amplifier (first amplifier) 2-2*a* and the amplifiers (second amplifiers) 4-1*a*, 4-2*a*, 5-1*a*, and 5-2*a* do not operate when the amplifier (first amplifier) 2-1*a* operates. In addition, the amplifier (first amplifier) 2-1*a* and the amplifiers (second amplifiers) 4-1*a*, 4-2*a*, 5-1*a*, and 5-2*a* do not operate when the amplifier (first amplifier) 2-2*a* operates. In addition, the amplifiers (first amplifiers) 2-1*a* and 2-2*a* and the amplifiers (second amplifiers) 4-2*a* and 5-2*a* do not operate when the amplifiers (second amplifiers) 4-1*a* and 5-1*a* operate. In addition, the amplifiers (first amplifiers) 2-1*a* and 2-2*a* and the amplifiers (second amplifiers) 4-1*a* and 5-1*a* do not operate when the amplifiers (second amplifiers) 4-2*a* and 5-2*a* operate.

In the present disclosure, the amplifier (first amplifier) 2-1*b*, the amplifier (first amplifier) 2-2*b*, the amplifiers (second amplifiers) 4-1*b* and 5-1*b*, and the amplifiers (second amplifiers) 4-2*b* and 5-2*b* operate exclusively. That is, the amplifier (first amplifier) 2-2*b* and the amplifiers (second amplifiers) 4-1*b*, 4-2*b*, 5-1*b*, and 5-2*b* do not operate when the amplifier (first amplifier) 2-1*b* operates. In addition, the amplifier (first amplifier) 2-1*b* and the amplifiers (second amplifiers) 4-1*b*, 4-2*b*, 5-1*b*, and 5-2*b* do not operate when the amplifier (first amplifier) 2-2*b* operates. In addition, the amplifiers (first amplifiers) 2-1*b* and 2-2*b* and the amplifiers (second amplifiers) 4-2*b* and 5-2*b* do not operate when the amplifiers (second amplifiers) 4-1*b* and 5-1*b* operate. In addition, the amplifiers (first amplifiers) 2-1*b* and 2-2*b* and the amplifiers (second amplifiers) 4-1*b* and 5-1*b* do not operate when the amplifiers (second amplifiers) 4-2*b* and 5-2*b* operate.

With the configuration of the sixth example of the third embodiment illustrated in FIG. 12, uplink CA using amplifiers (first amplifiers) may be realized, in addition to uplink CA using a plurality of combinations of amplifiers (second amplifiers). Specifically, uplink CA using the amplifier (second amplifier) 4-1*a* and the amplifier (second amplifier) 5-1*a* may be realized. In addition, uplink CA using the amplifier (second amplifier) 4-2*a* and the amplifier (second amplifier) 5-2*a* may be realized. Also, uplink CA using the amplifier (second amplifier) 4-1*b* and the amplifier (second amplifier) 5-1*b* may be realized. Additionally, uplink CA using the amplifier (second amplifier) 4-2*b* and the amplifier (second amplifier) 5-2*b* may be realized. In addition, uplink CA using the amplifier (first amplifier) 2-1*a* and the amplifier (first amplifier) 2-1*b* may be realized. Also, uplink CA using the amplifier (first amplifier) 2-2*a* and the amplifier (first amplifier) 2-2*b* may be realized. Additionally, uplink CA using a combination of up to four amplifiers (second amplifiers) may be realized, thereby further broadening the bandwidth of communication channels.

Although the above-described third embodiment has discussed the examples in which the amplifiers (second amplifiers) 4, 4-1, 4-2, 4-1*a*, 4-2*a*, 4-1*b*, 4-2*b*, 5, 5-1, 5-2, 5-1*a*, 5-2*a*, 5-1*b*, and 5-2*b* are two-stage-configuration RF power amplifiers configured by connecting two power amplifiers (PAs) in series, the present disclosure is not limited to these examples, and each of the above-mentioned amplifiers (second amplifiers) may be configured by one power amplifier (PA).

In addition, each of the above-mentioned amplifiers (second amplifiers) may be configured by including two or more such configurations illustrated in FIGS. 7 to 10, or by including three or more such configurations illustrated in FIG. 11.

The above-described embodiments are merely for facilitating the understanding of the present disclosure, and is not construed as limiting the present disclosure. The present disclosure may be changed or improved without necessarily departing from the spirit thereof, and the present disclosure also includes equivalents thereof.

Furthermore, the present disclosure may include the following configurations as described above or instead of the above.

(1) A power amplifier circuit according to an aspect of the present disclosure includes a first amplifier including two amplifiers connected in series with a matching circuit interposed therebetween, a first power supply circuit that supplies a first power supply voltage to a former amplifier of the first amplifier, and a second power supply circuit that supplies a second power supply voltage to a latter amplifier of the first amplifier.

In this configuration, power supply voltages are supplied from different power supply circuits to the former amplifier and the latter amplifier. Accordingly, the power supply voltage may be controlled appropriately for the former amplifier and the latter amplifier according to the output voltage of the first amplifier. In addition, unlike the configuration in which a delay circuit is provided on a power supply voltage supplying path to the latter amplifier, an insertion loss may be suppressed. Thus, power amplification with low distortion and high efficiency may be realized.

(2) In the power amplifier circuit of the above-described (1), in a first mode in which the first amplifier operates when output power of the first amplifier is greater than or equal to first output power, the first power supply circuit can output the first power supply voltage controlled by envelope tracking, and the second power supply circuit output the second power supply voltage controlled by envelope tracking.

(3) In the power amplifier circuit of the above-described (2), in a second mode in which the first amplifier operates when the output power is greater than or equal to second output power and less than the first output power, the second output power being less than the first output power, the first power supply circuit can output the first power supply voltage controlled by average power tracking, and the second power supply circuit output the second power supply voltage controlled by envelope tracking.

(4) In the power amplifier circuit of the above-described (3), in a third mode in which the first amplifier operates when the output power is less than third output power, the third output power being less than the second output power, the first power supply circuit can output the first power supply voltage controlled by average power tracking, and the second power supply circuit output the second power supply voltage controlled by average power tracking.

(5) In the power amplifier circuit of any one of the above-described (2) to (4), the first power supply circuit can generate the first power supply voltage based on a first envelope signal when outputting the first power supply voltage controlled by envelope tracking, and the second power supply circuit generates the second power supply voltage based on a second envelope signal when outputting the second power supply voltage controlled by envelope tracking, the second envelope signal being delayed by a delay in signal propagation to the latter amplifier of the first amplifier with respect to an input signal supplied to the first amplifier, as illustrated in FIG. 1.

With this configuration, deterioration of the distortion characteristics of the output signal due to the difference between the phase of the input signal supplied to the latter amplifier and the phase of the second power supply voltage may be suppressed.

(6) In the power amplifier circuit of any one of the above-described (1) to (5), the matching circuit can include a band-pass filter whose passband is a frequency band handled by the first amplifier.

With this configuration, noise input to the latter amplifier may be reduced.

(7) In the power amplifier circuit of the above-described (1) to (6), the former amplifier of the first amplifier can include two power amplifiers connected in series with a matching circuit interposed therebetween, and the latter amplifier of the first amplifier includes a power amplifier.

With this configuration, the configuration may be in accordance with the gain distribution of the power amplifiers.

(8) In the power amplifier circuit of the above-described (1) to (6), the former amplifier of the first amplifier can include a power amplifier, and the latter amplifier of the first amplifier includes two power amplifiers connected in series with a matching circuit interposed therebetween.

With this configuration, the configuration may be in accordance with the gain distribution of the power amplifiers.

(9) In the power amplifier circuit of the above-described (1) to (8), the first amplifier can include two first amplifiers, and, of the two first amplifiers, one first amplifier is stopped when the other first amplifier operates.

With this configuration, frequency bands handled by the two first amplifiers may be made different to realize multi-band communication.

(10) In the power amplifier circuit of the above-described (1) to (9), the power amplifier circuit can further include a second amplifier that includes at least one power amplifier.

With this configuration, a frequency band handled by the first amplifier and a frequency band handled by the second amplifier may be made different to realize multi-band communication.

(11) In the power amplifier circuit of the above-described (10), the second amplifier can include two second amplifiers, and, of the two second amplifiers, the first power supply voltage is supplied to one second amplifier, and the second power supply voltage is supplied to the other second amplifier.

With this configuration, frequency bands handled by the two second amplifiers may be made different to realize multi-band communication.

(12) In the power amplifier circuit of the above-described (11), the two second amplifiers can simultaneously operate when the first amplifier is stopped.

With this configuration, uplink CA using the two second amplifiers may be realized.

(13) In the power amplifier circuit of the above-described (10), the power amplifier circuit can include a plurality of second amplifiers to which the first power supply voltage is supplied, and a plurality of second amplifiers to which the second power supply voltage is supplied.

With this configuration, the configuration may support more frequency bands.

(14) In the power amplifier circuit of the above-described (13), when the first amplifier is stopped, one of the second amplifiers to which the first power supply voltage is supplied, and one of the second amplifiers to which the second power supply voltage is supplied simultaneously operate, and the second amplifiers other than the operating second amplifies can be stopped.

With this configuration, uplink CA using a plurality of combinations may be realized.

According to the present disclosure, power amplification with low distortion and high efficiency may be realized.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
 a first amplifier unit comprising:
  a former amplifier;
  a latter amplifier; and
  a matching circuit, the matching circuit being connected in series between the former and latter amplifiers;
 a first power supply circuit configured to supply a first power supply voltage to the former amplifier; and
 a second power supply circuit configured to supply a second power supply voltage to the latter amplifier, wherein:
 the first amplifier unit is configured to operate in a first mode when an output power of the first amplifier unit is greater than or equal to a first output power, and when the first amplifier unit operates in the first mode:

the first power supply circuit is configured to output the
first power supply voltage in accordance with an
envelope tracking scheme, and
the second power supply circuit is configured to output
the second power supply voltage in accordance with
the envelope tracking scheme,
the first power supply circuit is configured to generate the
first power supply voltage based on a first envelope
signal when outputting the first power supply voltage in
accordance with the envelope tracking scheme,
the second power supply circuit is configured to generate
the second power supply voltage based on a second
envelope signal when outputting the second power
supply voltage in accordance with the envelope tracking scheme, and
a phase of the second envelope signal is delayed from a
phase of the first envelope signal by a signal propagation delay of a signal supplied to the latter amplifier
with respect to an input signal supplied to the first
amplifier unit.

2. A power amplifier circuit comprising:
a first amplifier unit comprising:
a former amplifier;
a latter amplifier; and
a matching circuit, the matching circuit being connected in series between the former and latter amplifiers;
a first power supply circuit configured to supply a first
power supply voltage to the former amplifier;
a second power supply circuit configured to supply a
second power supply voltage to the latter amplifier;
a second amplifier unit comprising at least one power
amplifier; and
a plurality of second amplifier units to which the first
power supply voltage is supplied, and a plurality of
second amplifier units to which the second power
supply voltage is supplied.

3. The power amplifier circuit according to claim 1,
wherein:
the first amplifier unit is further configured to operate in
a second mode when the output power is greater than
or equal to a second output power and less than the first
output power, the second output power being less than
the first output power,
when the first amplifier unit operates in the second mode:
the first power supply circuit is configured to output the
first power supply voltage in accordance with an
average power tracking scheme, and
the second power supply circuit is configured to output
the second power supply voltage in accordance with
the envelope tracking scheme.

4. The power amplifier circuit according to claim 3,
wherein:
the first amplifier unit is further configured to operate in
a third mode when the output power is less than a third
output power, the third output power being less than the
second output power,
when the first amplifier unit operates in the third mode:
the first power supply circuit is configured to output the
first power supply voltage in accordance with the
average power tracking scheme, and
the second power supply circuit is configured to output
the second power supply voltage in accordance with
the average power tracking scheme.

5. The power amplifier circuit according to claim 2,
wherein when operation of the first amplifier unit is stopped:
one of the second amplifier units to which the first power
supply voltage is supplied, and one of the second
amplifier units to which the second power supply
voltage is supplied, are configured to simultaneously
operate, and
the remaining second amplifier units are configured to
stop operation.

6. The power amplifier circuit according to claim 1,
wherein:
the matching circuit comprises a band-pass filter having a
passband, the first amplifier unit being configured to
amplify signals having frequencies in the passband.

7. The power amplifier circuit according to claim 1,
wherein:
the former amplifier comprises two power amplifiers and
a matching circuit connected in series between the two
amplifiers.

8. The power amplifier circuit according to claim 1,
wherein:
the latter amplifier comprises two power amplifiers and a
matching circuit connected in series between the two
amplifiers.

9. The power amplifier circuit according to claim 1,
comprising:
two first amplifier units, wherein only one of the two first
amplifier units is configured to operate at a time.

10. The power amplifier circuit according to claim 1,
further comprising:
a second amplifier unit comprising at least one power
amplifier.

11. The power amplifier circuit according to claim 10,
comprising:
two second amplifier units,
wherein the first power supply voltage is supplied to a first
of the second amplifier units, and the second power
supply voltage is supplied to a second of the second
amplifier units.

12. The power amplifier circuit according to claim 11,
wherein:
the two second amplifier units are configured to simultaneously operate when operation of the first amplifier
unit is stopped.

13. The power amplifier circuit according to claim 10,
comprising:
a plurality of second amplifier units to which the first
power supply voltage is supplied, and a plurality of
second amplifier units to which the second power
supply voltage is supplied.

14. The power amplifier circuit according to claim 13,
wherein when operation of the first amplifier unit is stopped:
one of the second amplifier units to which the first power
supply voltage is supplied, and one of the second
amplifier units to which the second power supply
voltage is supplied, are configured to simultaneously
operate, and
the remaining second amplifier units are configured to
stop operation.

15. A power amplifier circuit comprising:
a first amplifier unit comprising:
a former amplifier;
a latter amplifier; and
a matching circuit, the matching circuit being connected in series between the former and latter amplifiers;
a first power supply circuit configured to supply a first
power supply voltage to the former amplifier; and a second power supply circuit configured to supply a second power supply voltage to the latter amplifier, wherein:

the first amplifier unit is configured to operate in a first mode when an output power of the first amplifier unit is greater than or equal to a first output power, and when the first amplifier unit operates in the first mode:
the first power supply circuit is configured to output the first power supply voltage in accordance with an envelope tracking scheme, and
the second power supply circuit is configured to output the second power supply voltage in accordance with the envelope tracking scheme, the first amplifier unit is further configured to operate in a second mode when the output power is greater than or equal to a second output power and less than the first output power, the second output power being less than the first output power, when the first amplifier unit operates in the second mode:
the first power supply circuit is configured to output the first power supply voltage in accordance with an average power tracking scheme, and
the second power supply circuit is configured to output the second power supply voltage in accordance with the envelope tracking scheme, the first amplifier unit is further configured to operate in a third mode when the output power is less than a third output power, the third output power being less than the second output power, and when the first amplifier unit operates in the third mode:
the first power supply circuit is configured to output the first power supply voltage in accordance with the average power tracking scheme, and
the second power supply circuit is configured to output the second power supply voltage in accordance with the average power tracking scheme.

16. The power amplifier circuit according to claim 15, wherein:
the matching circuit comprises a band-pass filter having a passband, the first amplifier unit being configured to amplify signals having frequencies in the passband.

17. The power amplifier circuit according to claim 15, wherein:
the former amplifier comprises two power amplifiers and a matching circuit connected in series between the two amplifiers.

18. The power amplifier circuit according to claim 15, wherein:
the latter amplifier comprises two power amplifiers and a matching circuit connected in series between the two amplifiers.

19. The power amplifier circuit according to claim 15, comprising:
two first amplifier units, wherein only one of the two first amplifier units is configured to operate at a time.

20. The power amplifier circuit according to claim 15, further comprising:
a second amplifier unit comprising at least one power amplifier.

* * * * *

UNITED STATES PATENT AND TRADEMARK OFFICE
CERTIFICATE OF CORRECTION

PATENT NO. : 11,394,348 B2
APPLICATION NO. : 16/854424
DATED : July 19, 2022
INVENTOR(S) : Kiichiro Takenaka Page 1 of 1

It is certified that error appears in the above-identified patent and that said Letters Patent is hereby corrected as shown below:

In the Specification

Column 5, Line 25, "about [dBm]" should be -- about 18 [dBm] --.

Column 10, Line 3, "if" should be -- 1f --.

Signed and Sealed this
Sixth Day of June, 2023

Katherine Kelly Vidal
*Director of the United States Patent and Trademark Office*